(12) United States Patent
Robbins

(10) Patent No.: US 9,870,074 B2
(45) Date of Patent: Jan. 16, 2018

(54) CONTROL PANEL FOR AIRCRAFT

(71) Applicant: Thales Holdings UK Plc, Surrey (GB)

(72) Inventor: David Robbins, Crawley (GB)

(73) Assignee: THALES HOLDINGS UK PLC, Surrey (GB)

( * ) Notice: Subject to any disclaimer, the term of this patent is extended or adjusted under 35 U.S.C. 154(b) by 70 days.

(21) Appl. No.: 14/903,625

(22) PCT Filed: Jul. 10, 2013

(86) PCT No.: PCT/GB2013/051832
§ 371 (c)(1),
(2) Date: Jan. 8, 2016

(87) PCT Pub. No.: WO2015/004407
PCT Pub. Date: Jan. 15, 2015

(65) Prior Publication Data
US 2016/0216781 A1    Jul. 28, 2016

(51) Int. Cl.
*G06F 3/0362*    (2013.01)
*B64D 43/00*    (2006.01)
*G06F 3/0484*    (2013.01)
*H03J 1/04*    (2006.01)

(52) U.S. Cl.
CPC ........... *G06F 3/0362* (2013.01); *B64D 43/00* (2013.01); *G06F 3/04847* (2013.01); *H03J 1/047* (2013.01)

(58) Field of Classification Search
USPC ..... 340/971, 988, 945, 309.16, 973; 40/971; 341/35; 345/184
See application file for complete search history.

(56) References Cited

U.S. PATENT DOCUMENTS

| 5,841,428 A | 11/1998 | Jaeger et al. |
| 5,872,528 A * | 2/1999 | Gaultier ................... G05G 1/10 341/192 |
| 6,326,956 B1 | 12/2001 | Jaeger et al. |

(Continued)

FOREIGN PATENT DOCUMENTS

| GB | 2174663 A | 11/1986 |
| WO | 03/036455 A1 | 5/2003 |
| WO | 2005/025986 A1 | 3/2005 |

OTHER PUBLICATIONS

International Search Report and Written Opinion for PCT/GB2013/051832, dated Apr. 2, 2014.

(Continued)

*Primary Examiner* — Carolyn R Edwards
*Assistant Examiner* — Deeprose Subedi
(74) *Attorney, Agent, or Firm* — Hauptman Ham, LLP; Sean A. Passino

(57) ABSTRACT

A control unit is provided with a selector and a plurality of value indicators. One of the value indicators provides a coarse indication of an existing value of an adjustable control quantity. The other value indicators are in another state, distinguishable from the value indicating state. A rotary adjustor provides a manual adjustment facility for a user. Selection of the selector puts the adjustable control quantity in an adjustment mode. In this adjustment mode, rotary actuation of the rotary adjustor allows adjustment of the control quantity. A new value of the control quantity is indicated by a change in the display states of the value indicators.

11 Claims, 6 Drawing Sheets

(56) References Cited

U.S. PATENT DOCUMENTS

| | | |
|---|---|---|
| 2003/0028261 A1 | 2/2003 | Peterson |
| 2004/0207607 A1 | 10/2004 | Specks et al. |
| 2005/0231391 A1* | 10/2005 | Boyns .................... G01C 23/00 340/945 |
| 2010/0097198 A1* | 4/2010 | Suzuki .................. G06F 3/0416 340/407.2 |
| 2010/0283636 A1 | 11/2010 | Clark et al. |
| 2012/0140933 A1 | 6/2012 | Sherwood et al. |
| 2012/0140934 A1 | 6/2012 | Sherwood et al. |

OTHER PUBLICATIONS

International Preliminary Report on Patentability for PCT/GB2013/051832, dated Jan. 21, 2016.
Garmin, "GMA™ 350H," https://buy.garmin.com/en-US/US/prod71339.html?cID=199?pID=71339, accessed from Internet Jul. 8, 2016.
BMW, "BMW Technology Guide: Controller," http://www.bmw.com/com/en/insights/technology/technology_guide/articles/controller.html, accessed from Internet Jul. 6, 2016.

* cited by examiner

10

CONTROL PANEL FOR AIRCRAFT

This application is a National Stage of International Application no. PCT/GB2013/051832 filed on Jul. 10, 2013.

FIELD

Embodiments disclosed herein relate to aircraft control panels.

BACKGROUND

Aircraft require manual control by pilots and other operatives. While automated control has become increasingly sophisticated, there remains a need for a pilot to engage with the control of an aircraft, particularly on landing and take-off, but also in-flight.

Control of an aircraft involves selection, by a user, of values for a multiplicity of control variables. Some control variables are binary, in that a control system is selected either to be in an 'On' state or an 'Off' state. An example of this is the deployment of landing gear. Other controls involve selection of a scalar quantity—the pilot is expected to select a value within a selection range. Yet further controls involve the selection of one of a set of options.

SUMMARY OF INVENTION

A first embodiment provides an aviation user interface unit for provision of a user interface for control of a controllable quantity, the user interface unit comprising
 a manually actuable selector associated with a controllable quantity;
 a plurality of value indicators arranged in association with the selector, the value indicators being operable in one of first, and second, visually distinguishable display states and a further visually distinguishable non-display state;
 a rotary adjuster capable of being manually rotated; and
 a control unit, the control unit being operable to store a current value for the controllable quantity, to map the stored current value to a corresponding one of a plurality of discrete values in the adjustment range, each discrete value corresponding to a respective value indicator, to assign a display state to a current value indicator of the value indicators, the current value indicator corresponding to the mapped discrete value, and to assign the non-display state to the remaining value indicators;
 the control unit being further operable to store a control condition of the controllable quantity, the control condition being indicative as to whether the controllable quantity is active or inactive, the control unit being operable to assign the first display state to the current value indicator if the control condition is indicative of inactivity of the controllable quantity;
 the control unit being responsive to actuation of the selector, if the current value indicator is in the first display state, to assign the second display state to the current value indicator and to assign the active control condition to the controllable quantity;
 the control unit being responsive to rotation of the rotary adjuster, if the current value indicator is in the second display state, to vary the current value stored by the control unit;

the control unit being further operable, when the controllable quantity is in the active control condition, to present an output comprising the current value of the controllable quantity.

Other features and advantages of the embodiments described herein may become apparent from the following detailed description and from the appended claims.

DRAWINGS

The present invention will now be described by way of example with reference to the accompanying drawings in which:—

DESCRIPTION

Figure 1:
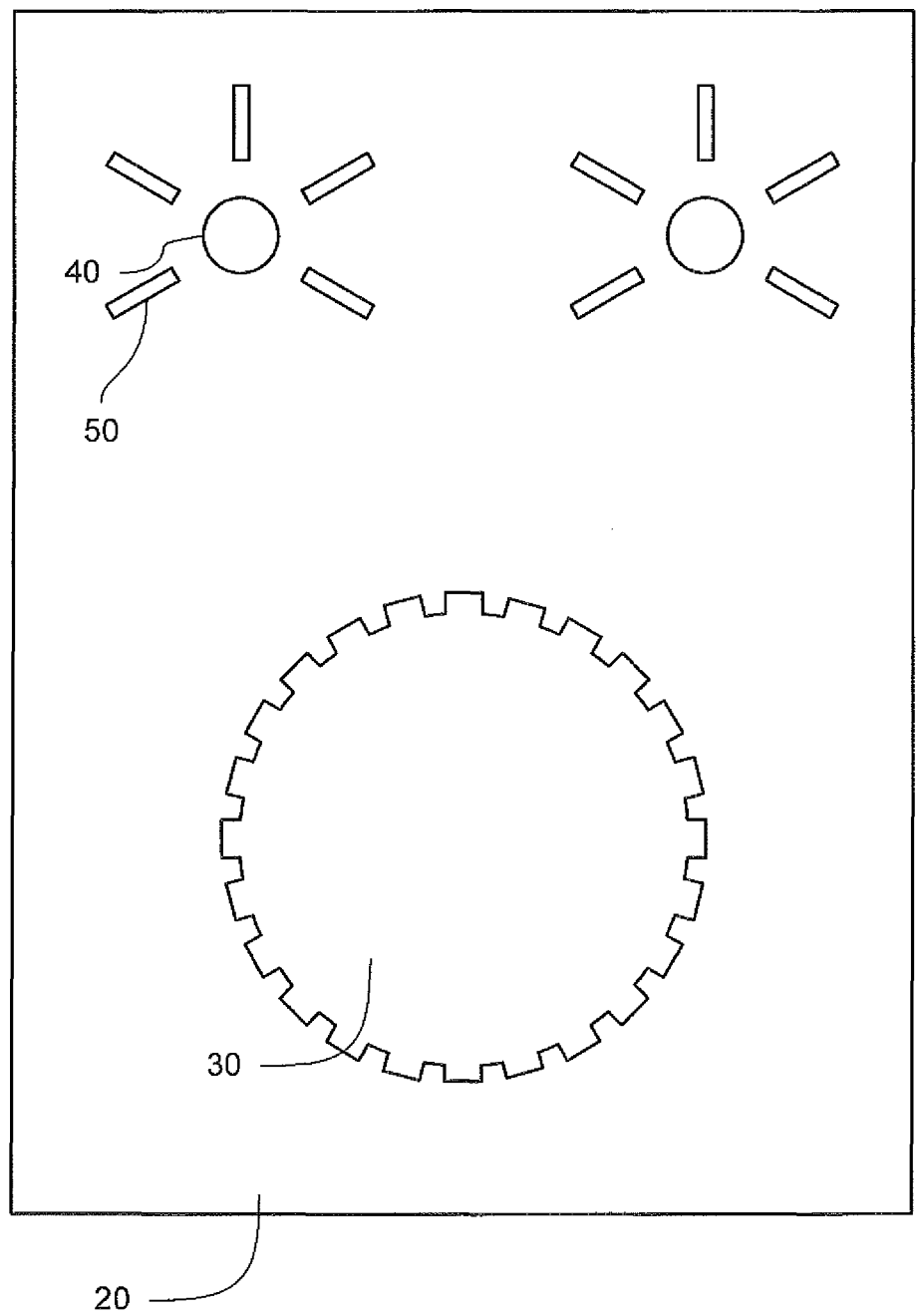
FIG. 1 illustrates a front panel of an aviation controller in accordance with a described embodiment.

FIG. 1 illustrates a front face of a controller in accordance with an embodiment described herein. As shown in FIG. 1, the controller 10 comprises a front plate 20 into which are mounted a rotary knob 30 and two selector buttons 40. The rotary knob 30 is substantially cylindrical, with formations (as illustrated, ribs) about its curved surface to aid gripping.

The selector buttons 30 are each surrounded by five indicators 50. The indicators are substantially rectangular, and radiate from their respective selector button 40. They are arranged about the selector button 40, at 60 degree intervals, so as to form a substantially hexagonal arrangement, the sixth point of the arrangement being vacant and located at the base of the arrangement. The indicators 50 are oriented so that one indicator is vertically above the button 40 as viewed. The arrangement encourages, in the mind of the user, a sense that the indicators range from a low value to a high value in an adjustment range. Labels or other markings may be applied to the front panel 20, adjacent the indicators 50 (or, in another example, overlaid on the indicators 50) to provide the user with information as to what each indicator signifies.

Figure 2:
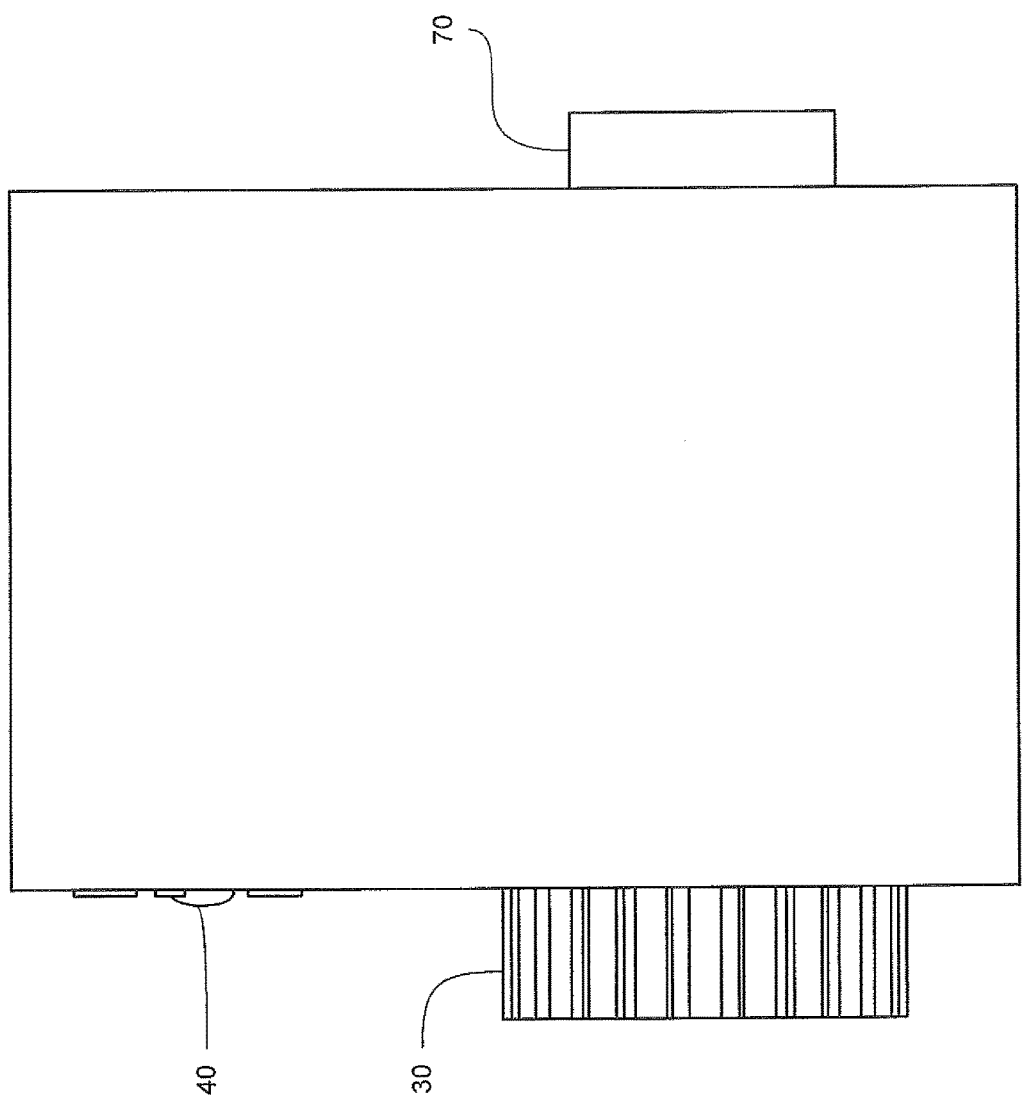
FIG. 2 illustrates a side elevation of the controller illustrated in FIG. 1.
Figure 3:
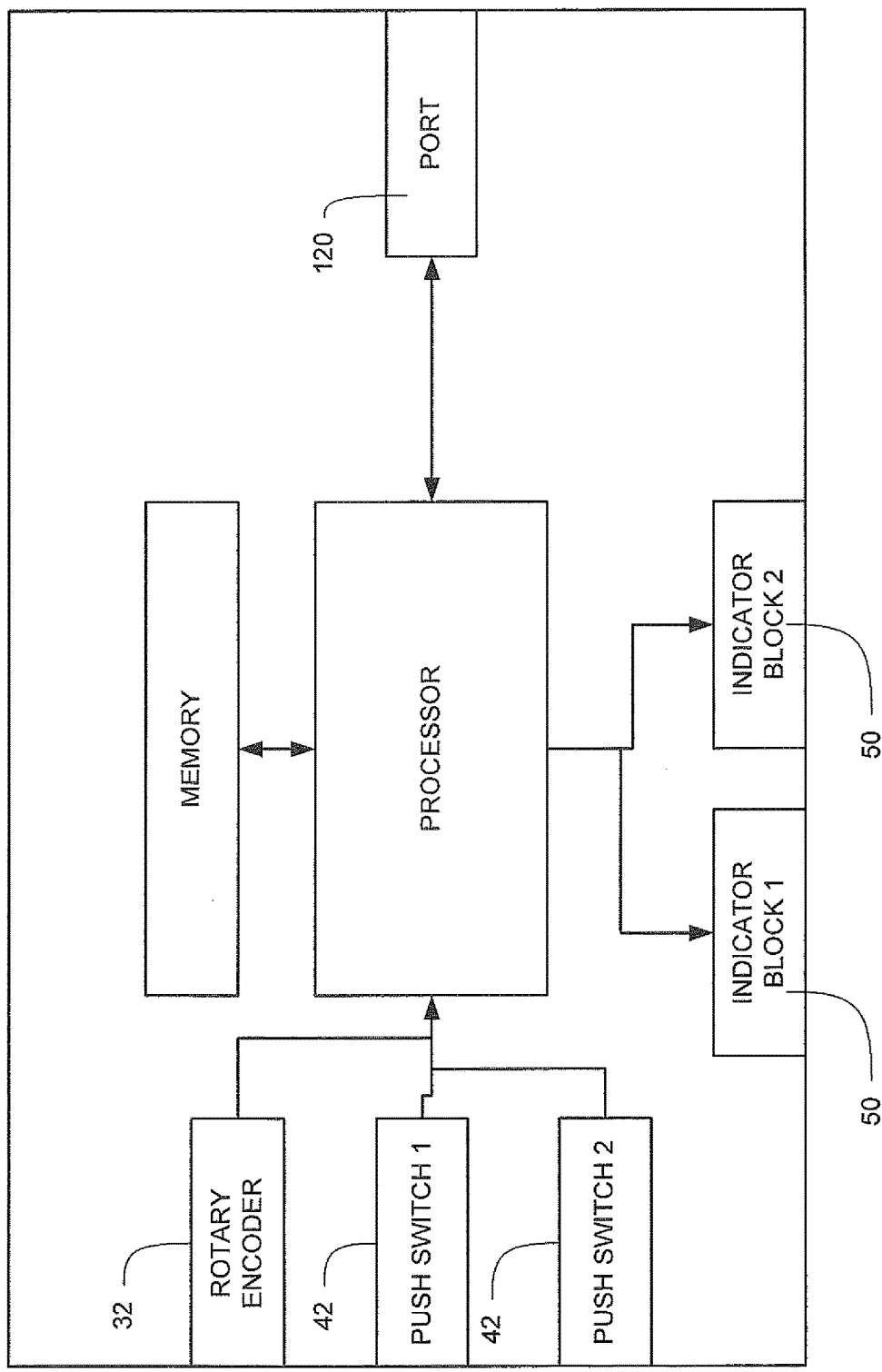
FIG. 3 is a schematic diagram of the controller illustrated in FIG. 1.

As illustrated further in FIG. 2, it will be seen that the selector buttons 40 are domed, to aid in tactile location. FIG. 2 also illustrates that the controller 10 comprises a connector 60, to enable connection of the controller to other electronics systems, and particularly to equipment controlled by the controller.

The controller 10 is illustrated as it might be envisaged for use in a rack based aircraft electronics system. In this way, it will be understood that the controller 10 might be slotted into an existing framework of control systems. However, the reader will appreciate that a more bespoke design is not excluded from consideration.

Figure 4:
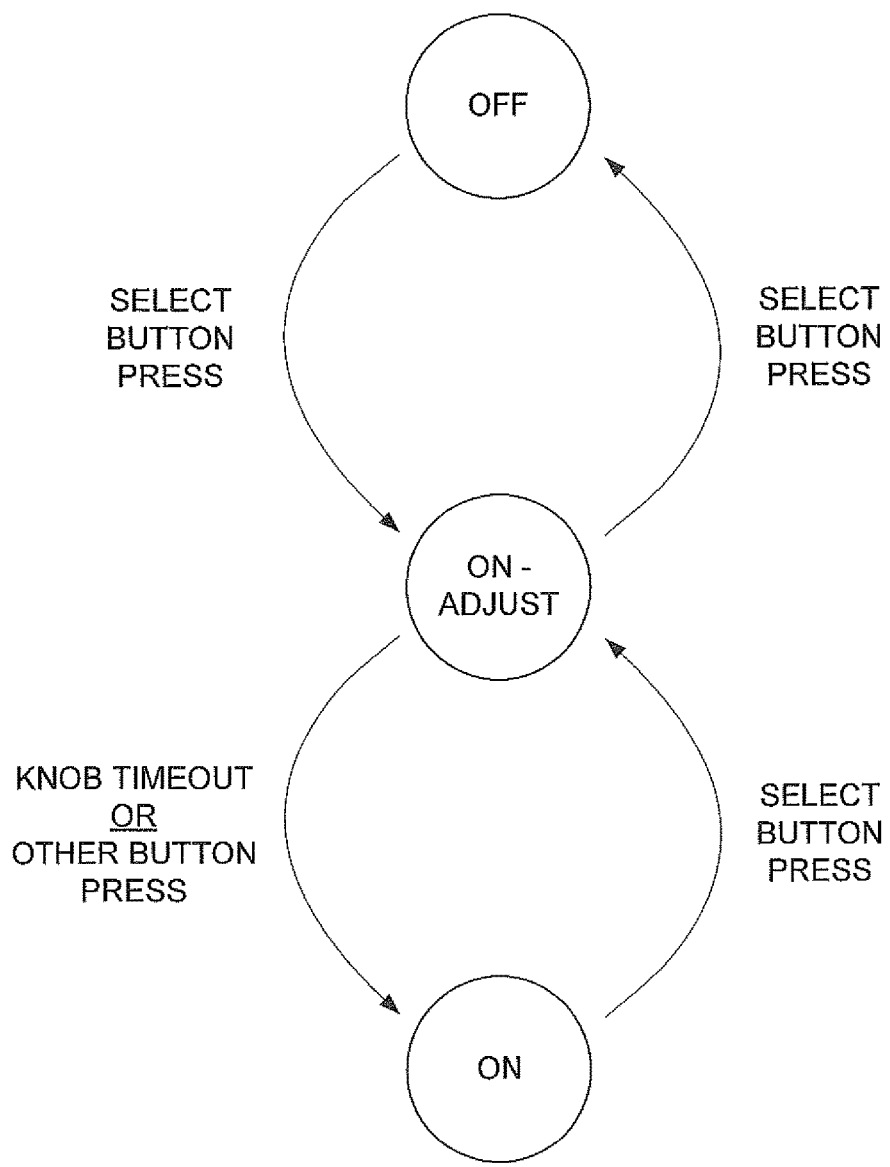
FIG. 4 is a state transition diagram for an indicator, in use, of the controller illustrated in FIG. 1.

As shown in FIG. 4, the various external elements of the controller, hitherto described, engage with internal electronic components of the controller. In particular, the external selector buttons 40 engage with internal push switches 42. Likewise, the rotary knob 30 engages with a rotary encoder, which translates rotational movement of the rotary knob about its axle (not illustrated) into electrical signals.

Signals from the rotary encoder 32 and the push switches 42 are passed to a processor 100, which is configured to process these signals under the control of a computer program, stored in memory 110. It will be understood that the configuration of the processor may be as illustrated, or a more integrated arrangement might be envisaged, such as an application specific device.

By this, the processor 100 is able to present output signals to the indicators (organised into indicator blocks, as illustrated) and control signals to a port 120 engaged with the connector 60.

The manner in which the processor 100 is programmed to respond to input signals generated as a result of actuation of the manually actuable switches and the rotatable knob, will now be described with reference to FIGS. 4 to 6.

First, in general terms, it should be understood that the device as illustrated is capable of controlling two controllable quantities. During use, an indicated selection will always display for each controllable quantity. For this, reference is made to FIG. 6.

Each of the views of a selected one of the indicator clusters essentially creates the impression of a dial. The "dial" provides a coarse indication of the currently selected value of the controllable quantity allocated to the indicator cluster in question. It will be understood by the reader that, though the indicator cluster only presents five possible level indications, the underlying controllable quantity may be capable of being varied over a finer quantization of possible values, or may even be controllable over a continuous (i.e. non-discrete) range. Thus, for example, if the controller is employed to control the volume level of audio presented to the user, it may be the case that the volume level can be adjusted through, for instance, over 50 different possible discrete volume levels. These volume levels would then be mapped on a many-to-one basis to the five available indicators, as only approximate indication to the user is required.

Figure 6A:
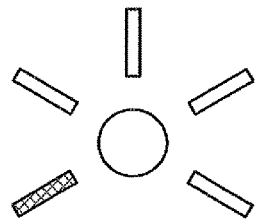
FIG. 6 is a series of representations of blocks of indicators in various states as will be described in due course.
Figure 6D:
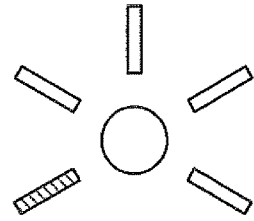
Figure 6B:
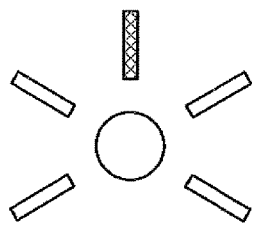
Figure 6E:
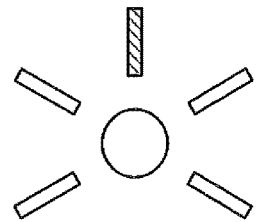
Figure 6C:
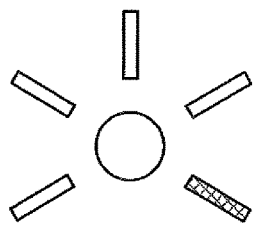
Figure 6F:
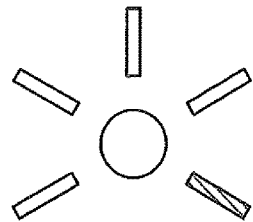

In FIGS. 6A, 6B and 6C, respectively, the indicators corresponding to "minimum", "medium" and "maximum" values for the controlled quantity are illuminated. Likewise, the same indicators are illuminated in FIGS. 6D, 6E and 6F. The distinction between, for example, FIGS. 6A and 6D is the colour of illumination. In this example, and with reference to the limitations imposed by the need to illustrate in black and white, FIG. 6A is intended to show illumination in green (using cross-hatching), while FIG. 6D shows illumination in white (using simple diagonal hatching). Those indicators that are not illuminated are depicted as blank outlines (i.e. no hatching). This likewise applies to the other figures.

The functionality of the controller will now be described.

In a first display state, described here as an "off" state, the indicator corresponding to the value of the controllable quantity will illuminate in white. This display state is indicative of the controllable quantity being unavailable (such as if controllable audio is muted). When the controllable quantity is to be adjusted, the user will select that controllable quantity, to be controlled, by pressing the respective dome button 40. On this, the illumination of the selected value of the controllable quantity will change colour, to green, and the illumination will change from continuous to intermittent (i.e. flashing).

In this second display state, described here as an "on-adjustable" state, the selected value is adjustable, by rotation of the rotatable knob 30. As will be appreciated, rotation of the knob 30 will cause adjustment of the selected value of the controllable quantity. Should the selected value be decreased or increased sufficiently, the selected value may map to another of the indicators. If that is the case, then this will cause activation of illumination of another of the indicators, and extinguishment of the hitherto illuminated indicator. The newly illuminated indicator will be intermittently illuminated in green, as befits the fact that the controllable quantity is still in the "on-adjustable" state.

In this "on-adjustable" state, user inactivity will trigger a timeout. This timeout will cause the controller to enter a third display state, described herein as an "on" state. In the "on" state, the controllable quantity is considered to be active, in that indication of the value of the controllable quantity is relevant. Thus, using the above example, the "on" state equates to the control of audio volume—when the audio is in use (i.e. not muted) the indicators will show the user the selected level of audio volume. The "on" state is associated with continuous illumination, in green, of the relevant indicator. This contrasts well with the white illumination associated with the "off" state.

From the "on" state, a single push button actuation will cause transition to the "on-adjustable" state.

In the "on" or "off" display states, therefore, a double depression of the push button will cause the controller to return the currently illuminated indicator to the previously mentioned "off" state, thus allowing for blind operation regardless of the current state.

This can be summed up in the context of the state transition diagram set out in FIG. 4. As can be seen, the state transitions provide that, from any initial display state, two actuations of the push button selector will result in the current indicator being assigned the "off" state.

An illuminator 50 can, of course, be extinguished. This condition is appropriate for all illuminators 50 in a cluster other than one which is in one of the "off", "on-adjustable" or "on" states noted above.

As shown, if an indicator is in the "off" state, a button depression will cause transition to the "on-adjustable" state. In this state, rotary motion of the rotatable knob 30 will be recognised by the processor. Detection of rotary motion can be translated into varying of the controlled quantity. If the controlled quantity is varied sufficiently, such that the value of the quantity maps to another indicator in the cluster, then the hitherto illuminated indicator will be extinguished and the newly mapped indicator will be illuminated (in the "on-adjustable" state, i.e. flashing green). The state transition process for the hitherto illuminated indicator will thus be exited altogether and the newly illuminated indicator would then adopt the same state transition process. In essence, therefore, the state transition process overlays the designation of the indicator to be illuminated.

If the timeout condition is satisfied, or if another push button is depressed, then the adjustment of the controlled quantity is considered to have ceased, and the controller therefore enters the "on" state in respect of this quantity. The currently active indicator is then continuously illuminated green, to indicate that control of the quantity persists, at the selected level.

In that "on" state, a further depression of the corresponding push-button will reinitiate the "on-adjustable" state. A further depression again will cause the controller to enter the "off" state in respect of that controllable quantity.

Table 1 sets out the four states in which an illuminator can be held:

| # | Name | Illumination | Comments |
|---|------|--------------|----------|
| 1 | "OFF" | White, continuous | Indicates that use of controllable variable is currently not selected |
| 2 | "ON-ADJUST" | Green, intermittent | Indicates that rotation of the knob will cause adjustment of the controllable variable |
| 3 | "ON" | Green, continuous | Indicates that function controlled by controllable variable is currently in use, at the level represented by the controllable variable |
| 4 | Not in use | None | Another indicator in cluster is lit, or equipment under control of controllable variable is not in use or unavailable |

Figure 5:
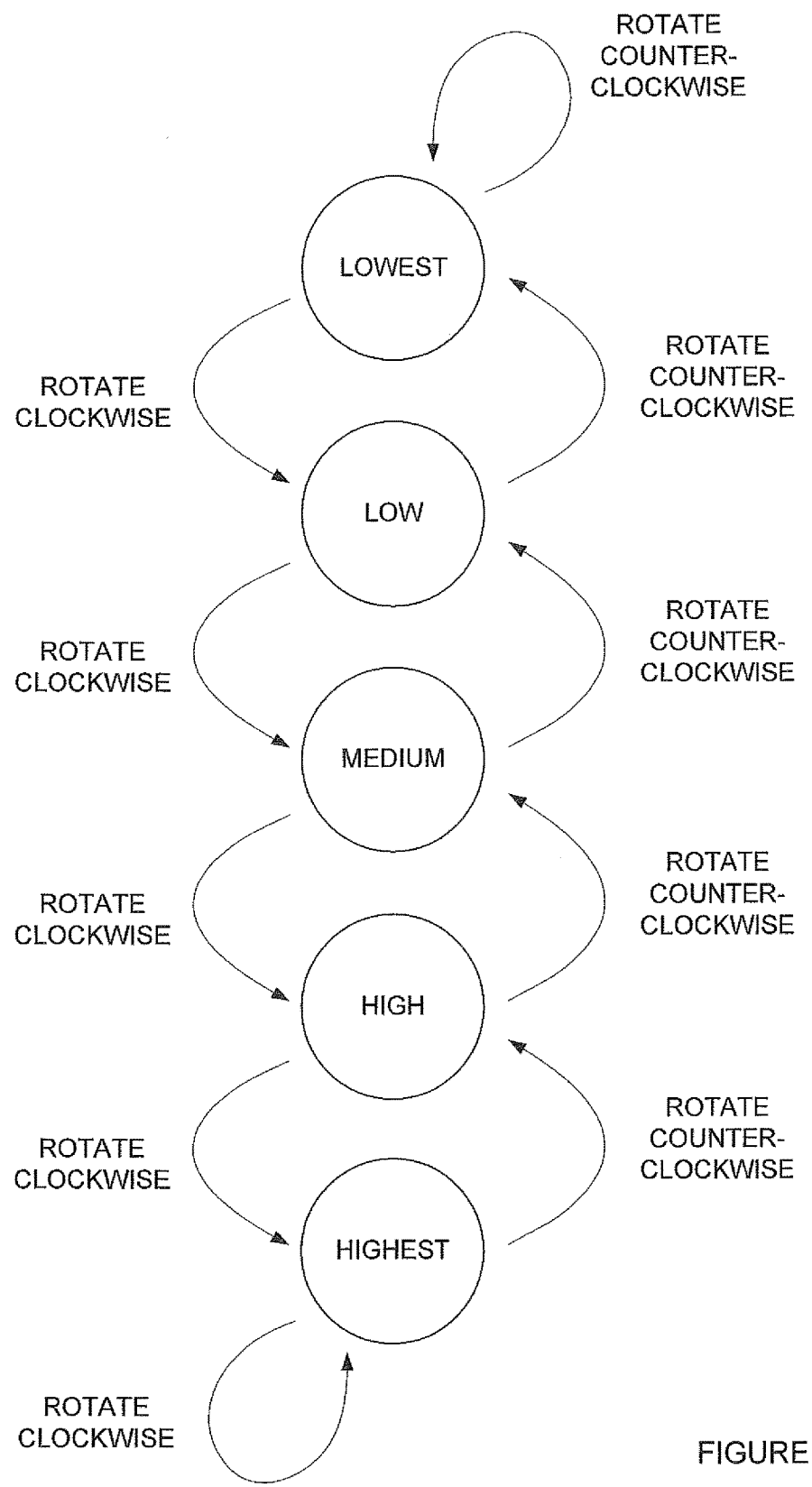
FIG. 5 is a state transition diagram for a block of indicators of the controller illustrated in FIG. 1.

FIG. 5 illustrates the response of the processor 100 to rotation of the rotatable knob. As will be understood, this only takes effect in respect of a controllable quantity corresponding to an indicator which is in the "ON-ADJUST" state. As shown, five value states are defined, ranging from "LOWEST" to "HIGHEST". To avoid needless repetition, the five states are not listed here—the reader is invited to make reference to the drawings.

The rotatable knob is configured to rotate smoothly, i.e. without significant variation in resistance to rotation. This reflects the fact that the rotational encoder may be capable of detecting relatively small angular displacements, and is not in any way tied to the discrete display provided by the five indicators of the indicator cluster. That is, while the indicator cluster is capable only of generating one of five different value states, the underlying control of the controllable variable may be much finer. For instance, if a range of a controllable variable is encoded by an 8-bit binary number, the variable can adopt one of 256 different values. This range can then be mapped to the 5 indicator levels by a simple division of the range, in a roughly 51-to-1 mapping. In summary, this provides coarse indication of a finely controlled variable.

The reader will appreciate that the present embodiment is not limited to control of controllable quantities. It may also be applicable to selection of one of many selectable options. So, for instance, different modes of use of an aircraft, each of which may be deemed mutually exclusive, can be defined, and then one of these modes can then be selected on one of these indicators. The embodiment is not limited to sets of five options, per indicator.

Further, while the embodiment indicates use of different colours to distinguish between states, it may also be possible to make distinction merely by difference in illumination intensity. That is, a low intensity illumination could be used for the first state ("OFF") while the second and third states ("ON-ADJUST" and "ON") would then be associated with higher intensity illumination.

Moreover, in a further variant from the above examples, it is possible to envisage use of another mode of illumination instead of the "extinguished" state. There may be circumstances in which it would be useful for all of the indicators in the so-called "extinguished" state to be illuminated at a low intensity while an indicator in a display state is illuminated at a distinguishable higher intensity, so providing a contrast. This would mean that, in conditions of darkness, the dial formation provided by the indicator cluster is apparent to the viewer so enabling the viewer to determine, at a glance, which indicator of the cluster is in a display mode.

As previously mentioned, the above described system can be used to control audio volume into an operator's headset. Audio could be generated from numerous sources. Each source could have a separate indicator cluster. Thus, while the illustrated embodiment shows two indicator clusters, the reader will appreciate that a controller may have many more clusters, depending on the application. The operator will have a need to control volume levels for each source, but the present embodiment enables this to be done with a single rotary control.

Each cluster represents a source. If a cluster is in the "on" state, this is indicative of that source being played out to the operator's headset. If a cluster is in the "off" state, the source is, in effect, muted. However, even in the "off" state, that source has an associated volume output, which is stored in the controller and is indicated by the corresponding indicator cluster.

The operator can determine, at a glance, which source is currently in the "on" state, because that source will be indicated by green illumination of the relevant indicator of that indicator cluster.

A source may be unavailable, in which case the indicator cluster in question will not indicate a volume level—all indicators of the cluster will be in an extinguished condition.

With that example, it is evident that a single button-push will put the associated indicator cluster (and associated control variable) into the "on-adjustable" state. If that indicator cluster had previously been in the "on" state, then this merely means that the operator can adjust the associated volume output for that source. If, on the other hand, that indicator cluster had previously been in the "off" state, then this also means that the audio output will change to the associated source, while placing any previously selected "on" state source into the "off" state.

Similarly, pressing one of the buttons twice can result in that indicator cluster being placed in the "off" state. This has the associated effect, in this example, of muting that audio source and, indeed, not activating any other audio source. This may be useful for an operator in that it enables the operator to eliminate audio quickly without looking at the panel to determine the current state of each illumination cluster—any double button selection will do.

On the other hand, it may be appropriate to mix sources together. In that case, selection of an indicator cluster which was previously in the "off" state will place the cluster in the "on-adjust" state (and thence, depending on circumstances, in the "on" state) while retaining another cluster in the "on" state. That would mean that the output to the operator (particularly in the audio example) would be a mix of two sources.

Finally, the above provides a layer of electronic control of controllable variables, which does not exclude the control of such variables by other means. For instance, some controls may be subject to automatic control, as well as manual control. It may be that other avionic components may be able to send control messages to the presently described controller, to set controllable variables to particular values. In any case, whether controlled manually or set automatically by other means, the indicators will indicate the present value of the controllable variables. The reader will appreciate that this is not achievable using mechanical switches and controls.

While certain embodiments have been described, these embodiments have been presented by way of example only, and are not intended to limit the scope of the inventions. Indeed, the novel methods, devices, and systems described herein may be embodied in a variety of other forms; furthermore, various omissions, substitutions and changes in the form of the methods, devices, and systems described herein may be made without departing from the spirit of the inventions. The accompanying claims and their equivalents are intended to cover such forms or modifications as would fall within the scope and spirit of the inventions.

The invention claimed is:

1. An aviation user interface unit for provision of a user interface for control of a controllable quantity, the user interface unit comprising:
   a manually actuable selector associated with a controllable quantity;
   a plurality of value indicators arranged in association with the selector, the value indicators being operable in one of first, and second, visually distinguishable display states and a further visually distinguishable non-display state;
   a rotary adjuster capable of being manually rotated; and
   a control unit,
   the control unit being operable to store a current value for the controllable quantity, to map the stored current value to a corresponding one of a plurality of discrete values in the adjustment range, each discrete value corresponding to a respective value indicator, to assign a display state to a current value indicator of the value indicators, the current value indicator corresponding to the mapped discrete value, and to assign the non-display state to the remaining value indicators;
   the control unit being further operable to store a control condition of the controllable quantity, the control condition being indicative as to whether the controllable quantity is active or inactive, the control unit being operable to assign the first display state to the current value indicator if the control condition is indicative of inactivity of the controllable quantity;
   the control unit being responsive to actuation of the selector, if the current value indicator is in the first display state, to assign the second display state to the current value indicator and to assign the active control condition to the controllable quantity;
   the control unit being responsive to rotation of the rotary adjuster, if the current value indicator is in the second display state, to vary the current value stored by the control unit;
   the control unit being further operable, when the controllable quantity is in the active control condition, to present an output comprising the current value of the controllable quantity.

2. A user interface unit in accordance with claim 1 wherein, when the current value indicator is in the second display state, the control unit is responsive to actuation of the selector to assign the first display state to the current value indicator and to assign the inactive control condition to the controllable quantity.

3. A user interface unit in accordance with claim 1 and including an inactivity timer operable to monitor for inactivity of the rotary adjuster when the current value indicator is in the second display state, the control unit being responsive to a determined inactivity of the rotary adjuster when the current value indicator is in the second display state to assign to the current value indicator a third display state visually distinguishable from the first and second display states and the inactive state.

4. A user interface unit in accordance with claim 3 wherein the inactivity timer is operable to detect for a predetermined period of inactivity of the rotary adjuster.

5. A user interface unit in accordance with claim 3 wherein, when the current value indicator is in the third display state, the control unit is responsive to actuation of the selector to assign the second display state to the current value indicator.

6. A user interface unit in accordance with claim 3 operable to illuminate a value indicator in the first display state in a first colour.

7. A user interface unit in accordance with claim 6 operable to illuminate a value indicator in the second display state in a second colour.

8. A user interface unit in accordance with claim 7 operable to continuously illuminate a value indicator in the third display state in the second colour, while operable to intermittently illuminate a value indicator in the second display state in the second colour.

9. A user interface unit in accordance with claim 1 operable to accept an input signal bearing an adjustment command and wherein the control unit is responsive to that adjustment command to adjust the stored current value for the controllable quantity.

10. A user interface unit in accordance with claim 1 operable to accept an input signal bearing an adjustment command and wherein the control unit is responsive to that adjustment command to change the stored control condition for the controllable quantity.

11. A user interface unit in accordance with claim 1, further comprising, in addition to the selector, one or more further selectors, each with associated value indicators, wherein the control unit is responsive to a manual actuation of any one of the selectors to assign the second display state to the current value indicator of the value indicators associated with the actuated selector and to assign the first display state to the current value indicator associated with each other selector.

* * * * *